United States Patent [19]

Schick

[11] Patent Number: 4,594,554

[45] Date of Patent: Jun. 10, 1986

[54] PROGRAMMED CONTROL OF ELECTRON BEAM POWER

[75] Inventor: Jerome D. Schick, LaGrangeville, N.Y.

[73] Assignee: International Business Machines Corporation, Armonk, N.Y.

[21] Appl. No.: 509,517

[22] Filed: Jun. 30, 1983

[51] Int. Cl.<sup>4</sup> .................. H01J 19/82; H05G 1/52
[52] U.S. Cl. .................. 328/268; 328/270; 378/113
[58] Field of Search .......... 328/270, 268, 259, 8; 377/16; 378/113

[56] References Cited

U.S. PATENT DOCUMENTS

| | | | |
|---|---|---|---|
| 1,505,198 | 8/1924 | Hough | 377/16 |
| 2,786,949 | 3/1957 | Boucher | 378/96 |
| 3,898,516 | 8/1975 | Nakasone | 315/194 |

Primary Examiner—Stanley D. Miller
Assistant Examiner—Richard Roseen
Attorney, Agent, or Firm—Sughrue, Mion, Zinn, Macpeak and Seas

[57] ABSTRACT

A method of extending the lifetime of an electron beam filament, typically $LaB_6$ by applying power to the filament over a preselected period in a substantially linear manner. The time period is typically 20 minutes before a steady state power level is attained with a fully stabilized instrument. Power-down is a reverse of the power-up sequence until all power is removed.

7 Claims, 2 Drawing Figures

PROGRAMMED CONTROL OF ELECTRON BEAM POWER

BACKGROUND OF THE INVENTION

This invention relates to a method for prolonging the useful life of filaments used in electron microbeam tools. In particular, this invention relates to a method of controlling the power to the filament to the saturation point and then controlling the power reduction when the apparatus is turned off.

Electron microbeam tools utilize filaments which are typically lanthanum hexaboride ($LaB_6$). The filament may be a single crystal or polycrystalline material. Such filaments are used in devices such as scanning electron beam microscopes and the like. The filament is typically mounted on carbon filament ribbons and heated by current supplied to the ribbons. In operation such filaments typically operate at approximately 6 watts of DC power. In order to be acceptable processing and diagnostic tools, these filaments must be stable, that is, precisely immobile, with no fluctuations in current during operation. The lifetime of such a filament is critical to continuous operation of the instrument and to reduce the down time of the device. Each time the filament is replaced, the instrument must be realigned and pumped down, both time consuming procedures.

Stability of the filament current is also crucial—any change will disturb the filament resulting in warpage thereby shortening its lifetime. Such warpage also affects system resolution which, in the case of an E-beam, is in the Angstrom range. A second deficiency related to changes in filament current is contamination, that is, a deposition of a contaminant on the filament tip. Contamination reduces the emission of filament electrons.

With prior art the filament power is generally manually increased at various rates up to the saturation point, that is, the point at which an increase in current filament does not result in a further increase in filament power. There is, however, no regime or program for increasing filament power to the saturation point and then correspondingly decreasing filament power once operation is complete. Thus, within the prior art the usable lifetime of filaments is generally 100–200 hours.

U.S. Pat. No. 2,786,949 relates to a technique for controlling the voltage to X-ray tube devices. In particular, in this patent, a system is disclosed for the partial automation and the prevention of power restoration following interruption. A technique of X-ray tube warm-up is disclosed wherein the power is turned up at a gradual rate, usually within 30 seconds to one minute, as opposed to an abrupt application of full power. Thus, tube warm-up is not disclosed relative to a program gradual power increase at a specific and controlled rate. Moreover, this prior art device does not recognize that X-ray tubes are subjected to severly short lifetime problems as in the case of electron beam filaments. That is, in this patent, the high voltage of the X-ray tube, and thus the cathode current rather than the filament current is controlled. Given the heat generation in these devices, water is generally supplied for purposes of cooling and therefore the lifetime of the tube would not be appreciably improved since the cathode current, and not the bombardment, potential governs the X-ray tube lifetime. Consequently, turning up the power by the technician is a technique of controlling the high voltage to the tube.

Other techniques for preventing damage of electronic devices by controlling the power are set forth in the prior art. Reference is made to U.S. Pat. No. 3,810,025 relating to a technique of protecting the emitter of an electron gun by decreasing the impedance between the emitter and its associated electrode when an electrical breakdown occurs. U.S. Pat. No. 4,112,334 discloses and ignition circuit for extending the life of a gas-filled electrical lamp. The circuit applies a first level of power to an electrode prior to ignition followed by increasing the level of power within a proscribed time frame.

SUMMARY OF THE INVENTION

Given the deficiencies of the prior art, it is an object of the present invention to provide a method of increasing the lifetime of heated filaments in electron beam sources.

A further object of this invention is to provide a method by which contamination of the electron beam filament is reduced thereby reducing and virtually elimating instability of the electron beam source.

Yet another object of this invention is to define a system whereby a fully automated power on and automatic shut-down of the instrument occur.

These and other objects of this invention are achieved by a method of controlling the filament current to an electron beam source. The current is increased at a programmed rate, preferably linear, in a precisely repeatable fashion. The increase occurs at a continuous, predetermined level to the saturation point of the device. When this sequence is complete, the instrument is fully powered-up and stabilized. Thus, in contrast to the prior art, there is no need to stabilize one the system power has been turned on.

Thereafter, the electron beam source is maintained at a constant level during operation. When processing is completed, the current is decreased along an automatic, predetermined mode at a repeatable and continuous rate until power to the device is completely terminated. In accordance with the present invention, current is increased continuously over a period of time of 18 minutes, or, depending on the properties of the actual filament being used, over a similar fixed period of time, generally in the range of 15-20 minutes. A continuous current increase is effectuated by a Variac, the output of which comprises the primary current to the filament current transformer of an electron beam instrument under control.

In a preferred embodiment of the invention, the method is accomplished by utilizing a reversing motor having a 30-1 gear reduction mechanism to provide a precise rotational rate necessary to increase the filament current. Thus, for a motor rotating at 1.0 rpm, coupled to such a 30:1 gear reduction, a rotational rate of 12°/minute results. Precise current increases in the range of 180 mA/minute can be achieved.

Adjustability in the system is attained by utilizing limit switches which are adjustable for saturation and off positions. In order to determine saturation levels a defeat switch is used to override the limit switches. Trimming potentiometers are disposed in series with the Variac to compensate for small variations during the life of the filament. A clock is also utilized in the system to measure operating time, that is, only when saturation power has been achieved such that a uniform measure of filament life can be obtained.

This invention will be described in greater detail by referring to the attached drawing and the description of the preferred embodiment that follows.

DESCRIPTION OF THE PREFERRED EMBODIMENT

Figure 1:
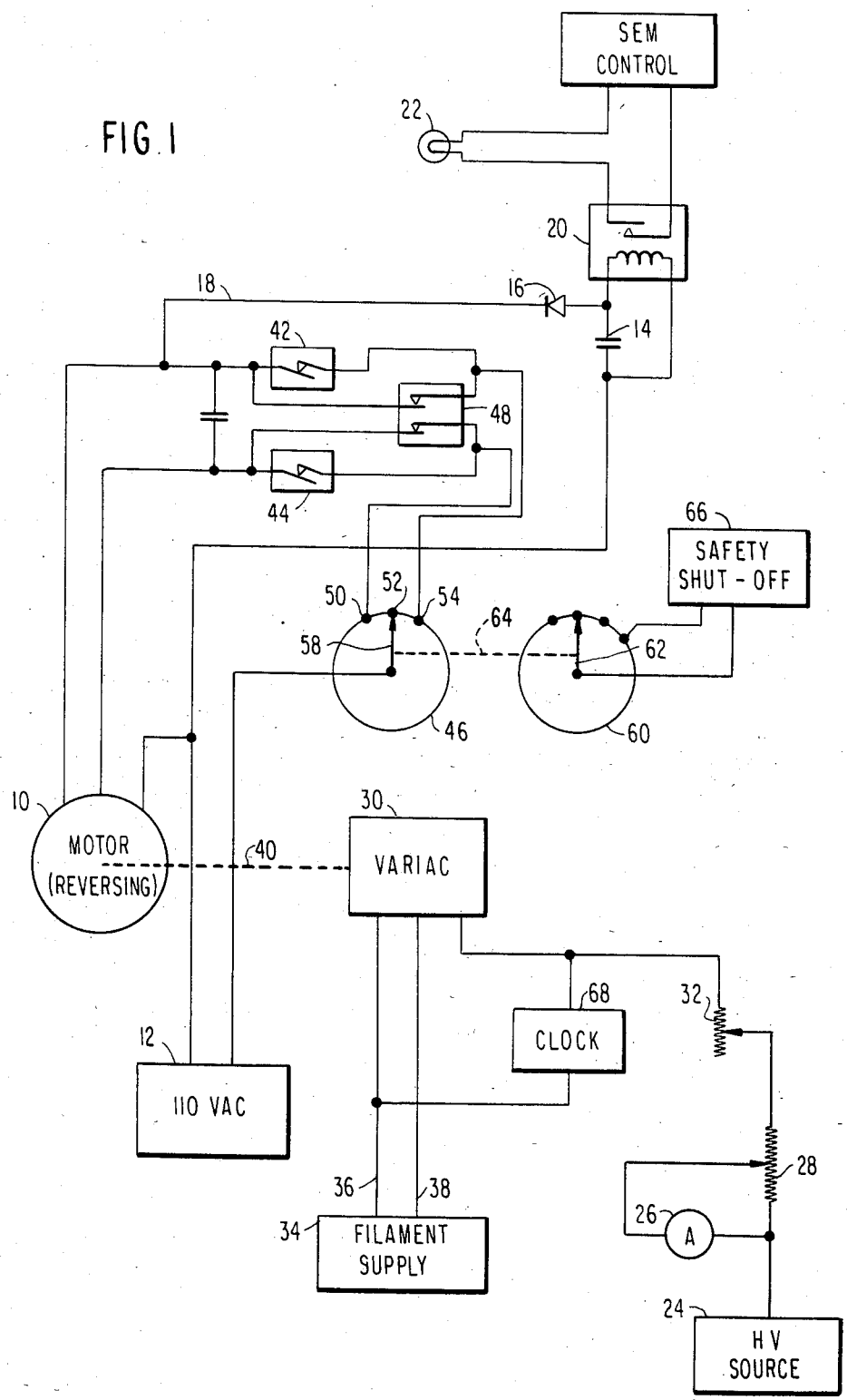
FIG. 1 is a schematic circuit drawing showing one technique of implementation of the present invention.

Referring now to FIG. 1, one implementation of this invention is shown. A reversing motor 10 is a fully symmetric dual winding AC motor having two pairs of windings. One set of windings is utilized for rotation in a first direction while the second set is used for rotation in a second direction. Two sets of windings are employed so that the filament (not shown) to the scanning electron device, for example a scanning electron microscope (SEM), will experience the same rate of change of current in both directions. Input power to the system is supplied by a 110 VAC power supply 12 providing current to the motor 10 and to a relay switch via a filter capacitor 14. Thus, the output along line 18 provides through rectifying diode 16 one dc input to the relay 20.

The relay 20 responsive to input ac power is used to illuminate a power panel light 22 providing a status indication of system operation. The relay 20 also functions to automatically control the SEM device such that when the control functions of the system are terminated the SEM is automatically turned off.

A high voltage source 24, typically 30–50 KV, provides the power input which is varied and supplied to the filament of the SEM. Current to the filament is measured by ammeter 26 calibrated by means of potentiometer 28. A Variac 30 receives an adjusted output via trimming potentiometer 32 and, as a function of motor control, provides a control current output to the filament supple 34 along output lines 36 and 38.

Figure 2:
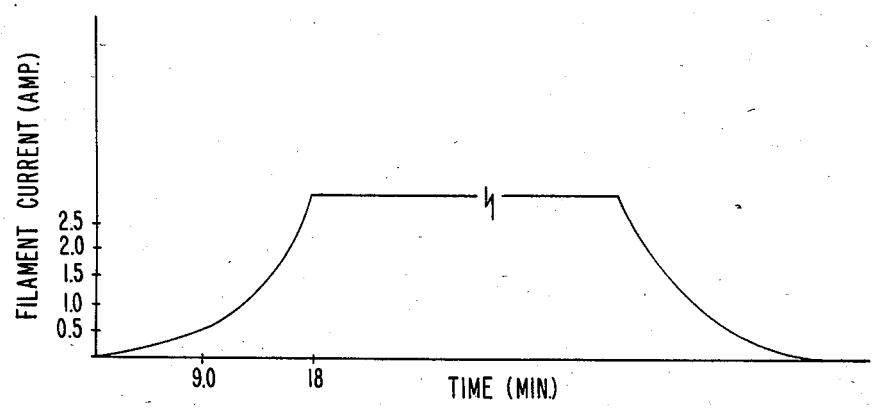
FIG. 2 is a current-time chart showing one preferred control rate for the program control of current to an electron beam device.

In accordance with the present invention, the motor 10 is mechanically linked to the Variac 30 via linkage 40. As the motor 10 rotates through a 30:1 gear reduction, a rotational rate of approximately 12°/min occurs at a roational rate of 1.0 RPM of the motor. The linkage 40 coupled to the Variac uniformly and continuously causes a current change of approximately 180 mA/min. This variation in current is shown in FIG. 2. This current-time chart will be explained herein as an example of the operation of this invention.

Referring back to FIG. 1, a switch network comprises a first limit switch 42 and a second limit switch 44 which are used to interrupt power to the reversing motor 10 at various points in the duty cycle of the device in response to operation of a four position switch 46. Limit switch 42 operates in response to the switch 46 such that when the saturation point for the filament has been reached, rotation of the motor is terminated by discontinuing the power supply. Conversely, limit switch 44 is operable to discontinue power to the motor when the off position has been reached during a power-down phase. That is, limit switch 42 has a discrete control cam position set for the saturation point, and limit switch 44 has a discrete control cam position set for the power-off phase. During power-up operations limit switch 42 remains closed supplying current to the motor 10 until it is opened by the power-up cam (not shown), indicating that the saturation point has been reached and discontinuing power to the motor. Conversely, limit switch 44 remains closed during power-down operation. With the switch 46 set for a power-down phase, limit switch 44 is placed into the circuit and continues to supply power to the motor, now operating in a reverse direction to continuously decrease the output of the Variac until 0 output state has been reached. The power-down cam (not shown) then opens limit switch 44 discontinuing power to the motor.

A defeat switch 48 is present to override both limit switches 42 and 44. The defeat switch is used to continuously supply power to the motor so that the saturation point of the filament in the off positions can be ascertained. As is appreciated from the above description, the motor will rotate in a first direction when switch 46 is set to contact 50 and in a reverse direction when switch 46 is set to contact 54. When those points have been established, the cam positions of the switch 46 are adjusted so that proper operation of the limit switches 42 and 44 occurs. It will be appreciated that the switch 46 has been only schematically shown having four contacts 50, 52, 54 and 56 selectively actuated via wiper arms 58 and 62. Internal wiring to establish continuity between pairs of the contact points 50–56 pending on wiper position is well known in the technology and need not be described in detail.

A second deck switch 60, containing contact 56, has its wiper arm 62 ganged to the wiper arm 58 of switch 46 by means of a coupling 64 shown schematically. The second switch 60 is coupled to a safety shut off member 66 which can be used to immediately deactuate the SEM and its power supplies and to discontinue power to the motor.

An important aspect of the circuit shown in FIG. 1 is the use of a clock 68 which is used to measure the actual saturation state time of the filament. The clock is adjusted to begin operation immediately before the saturation point is reached and to stop just after the power-down phase commences, that is, with the current decreasing. Thus, the clock accurately measures filament hours at the saturation level. Such is important to have a complete understanding of the actual operation of the filament itself at its operating levles, not including power-up and power-down times.

In accordance with the present invention, as shown in FIGS. 1 and 2, when the electron beam device, for example a scanning electron microscope, is to be powered up, the operator initiates the power-on sequence utilizing switch 46. As shown in FIG. 1, initiation of the switch 46 begins a timed sequence wherein the wiper 58 is at its first position such that power to the reversing motor 10 is established through limit switch 42. The reversing motor 10 is then driven in a uniform and stable manner through a first set of windings at a rate of approximately 1.0 rpm such that when coupled through a gear reduction mechanism produces a rotation of 12°/min to actuate the Variac 30. A current increase of approximately 180 mA/minute occurs.

As shown in FIG. 2, the current increase to the filament supply 34 is very gradual, that is, of a shallow slope from the initiation of the sequence through approximately eight minutes of operation. The slope is then constant from approximately eight minutes through 18 minutes of operation such that a uniform, linear increase in current to the filament occurs during power-up. The saturation point is reached at approximately 18 minutes, a point empirically determined for a particular filament. At that point in the sequence, switch 42 is opened by the cam such that power to the motor is interrupted and rotation ceases. Filament current is then at a steady state, the saturation point having been reached. Operation of the electron beam device with the filament in a saturated and stable condition occurs with the clock 68 monitoring the actual time at which the filament is operated in a saturated state.

When power-down is to occur, the operator then turns the switch 46 into a power-down position and the reverse sequence shown in FIG. 2 occurs. That is, a gradual decrese from the 18 minute point down to a zero power state takes place with the motor operation now occuring through a second and separate set of windings with power through limit switch 44. Rotation of the motor in an opposite direction causes the Variac 30 to continuously and uniformly decrease current to the filament from the saturation point down to a zero power state.

By utilizing this technique, the lifetime of the filament is extended well beyond the normally established limits.

EXAMPLE

An AMR-SEM filament having a normal lifetime of 200 hours was operated under controlled conditions utilizing the power-up and power-down sequence as described herein. At 1105 hours of filament operation the device was disassembled for purposes of realigning the electron beam column. Upon disassembly the filament, grid and anode cap were reassembled without cleaning, there being no filament contamination present. Under test conditions the filament has been used in excess of 2000 saturation hours. By contrast, the longest filament life of such a Lanthanum Hexaboride filament is about 400 hours.

While this invention has been described relative to one implementation of the method of this invention, it is apparent that other techniques of implementation may be utilized. For example, solid state timing and control devices may be utilized in place of the system described herein. So long as current to the filament supply can be varied in a uniform and linear manner over a predetermined time frame with adjustability for determining the saturation point of various filaments, implementation is not limited by the embodiment shown in FIG. 1.

Also, while the invention has been described relative to a directly heated filament, it is apparent that the invention can also be utilized with an indirectly heated filament.

I claim:

1. A method for extending lifetime of a tool having a contamination prone electron microbeam filament serving as a cathode in a triode structure, comprising steps of:
    (a) establishing electrical continuity between said microbeam filament and a supply of electrical power;
    (b) gradually increasing the power supplied to the microbeam filament over a predetermined time interval measured in excess of minutes from zero power level to a microbeam filament saturation power level at which the microbeam filament no longer continues to demonstrate an increase in beam intensity for increases in beam power while thermal equilibrium of said filament is achieved such that a contamination free electron beam source is maintained;
    (c) maintaining power to said microbeam filament at substantially the saturation level during use of the tool to maintain thermal equilibrium of said filament, and
    (d) gradually decreasing the power supplied to the microbeam filament over a predetermined time interval also measured in excess of minutes from substantially the saturation power level to a zero power level when the microbeam filament is turned off while maintaining thermal equilibrium of said filament.

2. The method of claim 1 wherein the predetermined time intervals of gradually increasing power and gradually decreasing power are substantially equal.

3. The method of claim 1 wherein said gradual increase in power follows a predetermined current-time curve and said gradual decrease in power follows a reciprocal current-time curve.

4. The method of claim 1 further comprising determining a point where saturation level of said microbeam filament occurs and adjusting the output of said supply of electrical power to match said saturation point.

5. The method of claim 1 further comprising measuring a length of time said microbeam filament is at the saturation level.

6. The method of claim 1 wherein said step of gradually increasing power is substantially a linear increase in power.

7. The method of claim 1 wherein the step of gradually decreasing power is a substantial decrease in power.

* * * * *